(12) United States Patent
Barsukou

(10) Patent No.: US 12,081,941 B2
(45) Date of Patent: Sep. 3, 2024

(54) ACOUSTIC DEVICES WITH FEEDBACK CONTROL OF ACOUSTIC RESISTANCE

(71) Applicant: Skyworks Solutions, Inc., Irvine, CA (US)

(72) Inventor: Siarhei Dmitrievich Barsukou, Takarazuka (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/664,013

(22) Filed: May 18, 2022

(65) Prior Publication Data

US 2022/0408185 A1 Dec. 22, 2022

Related U.S. Application Data

(60) Provisional application No. 63/202,608, filed on Jun. 17, 2021, provisional application No. 63/202,611, filed on Jun. 17, 2021.

(51) Int. Cl.
*H04R 17/02* (2006.01)
*B81B 3/00* (2006.01)
(Continued)

(52) U.S. Cl.
CPC .......... *H04R 17/02* (2013.01); *B81B 3/0021* (2013.01); *H04R 3/02* (2013.01);
(Continued)

(58) Field of Classification Search
CPC .... H04R 17/02; H04R 3/02; H04R 2201/003; H04R 3/06; H04R 17/10; H04R 31/00;
(Continued)

(56) References Cited

U.S. PATENT DOCUMENTS 6,795,374 B2 9/2004 Barnes et al.
8,036,401 B2 10/2011 Poulsen et al.
(Continued)

FOREIGN PATENT DOCUMENTS

EP 3809476 A1 4/2021
EP 3937509 A1 6/2021
(Continued)

OTHER PUBLICATIONS

U.K. Intellectual Property Office, Combined Search and Examination Report, dated Nov. 22, 2022, 5 pages.

*Primary Examiner* — Carolyn R Edwards
*Assistant Examiner* — Kuassi A Ganmavo
(74) *Attorney, Agent, or Firm* — Knobbe, Martens, Olson & Bear LLP

(57) ABSTRACT

A piezoelectric MEMS microphone includes a substrate and a piezoelectric sensor movably coupled to the substrate. The piezoelectric sensor includes a multilayer cantilever beam with multiple piezoelectric layers and multiple metal electrode layers. The beam is attached to the substrate and extends to a distal tip at a free unsupported end. A feedback control circuit is electrically connected to one or more of the metal electrode layers and applies a direct current bias voltage between at least two of the metal electrode layers to actively control an acoustic resistance of the piezoelectric sensor.

18 Claims, 8 Drawing Sheets

(51) Int. Cl.
    *H03H 9/02*    (2006.01)
    *H03H 9/125*    (2006.01)
    *H03H 9/17*    (2006.01)
    *H04R 3/02*    (2006.01)
    *H04R 3/06*    (2006.01)
    *H04R 17/10*    (2006.01)
    *H04R 31/00*    (2006.01)

(52) U.S. Cl.
    CPC .. *B81B 2201/0257* (2013.01); *H03H 9/02244* (2013.01); *H03H 9/125* (2013.01); *H03H 9/17* (2013.01); *H04R 3/06* (2013.01); *H04R 17/10* (2013.01); *H04R 31/00* (2013.01); *H04R 2201/003* (2013.01)

(58) Field of Classification Search
    CPC .......... B81B 3/0021; B81B 2201/0257; H03H 9/02244; H03H 9/17; H03H 9/125; H03H 2009/155
    See application file for complete search history.

(56) References Cited

U.S. PATENT DOCUMENTS

| | | |
|---|---|---|
| 8,041,056 B2 | 10/2011 | Kinoshita |
| 8,831,246 B2 | 9/2014 | Josefsson |
| 9,357,296 B2 | 5/2016 | Josefsson et al. |
| 9,479,875 B2 | 10/2016 | Hall et al. |
| 9,602,924 B2 | 3/2017 | Josefsson |
| 11,212,623 B2 | 12/2021 | Duan |
| 2006/0230835 A1* | 10/2006 | Wang ..................... H04R 19/00 73/718 |
| 2008/0122317 A1* | 5/2008 | Fazzio ................... H04R 17/02 381/173 |
| 2009/0301196 A1* | 12/2009 | Wang ................... G01N 29/022 73/579 |
| 2010/0246859 A1 | 9/2010 | David et al. |
| 2011/0124124 A1* | 5/2011 | Shih ................... G01N 29/2437 422/69 |
| 2011/0293115 A1 | 12/2011 | Henriksen |
| 2012/0224722 A1* | 9/2012 | Nystrom ................ H04R 3/007 381/111 |
| 2016/0249122 A1* | 8/2016 | Popper ................... B81B 7/008 |
| 2017/0318385 A1* | 11/2017 | Harney .................. H04R 19/04 |
| 2018/0077497 A1* | 3/2018 | Hatipoglu .......... H03H 9/02244 |
| 2018/0186623 A1* | 7/2018 | Vossough ........... H01L 29/0669 |
| 2019/0289405 A1* | 9/2019 | Littrell .................... H04R 19/04 |
| 2019/0327562 A1 | 10/2019 | Cerini |
| 2020/0100033 A1 | 3/2020 | Stoppel et al. |
| 2022/0073342 A1 | 3/2022 | Ho |
| 2022/0166403 A1* | 5/2022 | Doll ..................... H03H 9/2463 |

FOREIGN PATENT DOCUMENTS

| | | |
|---|---|---|
| EP | 3944632 A2 | 6/2021 |
| JP | 2010232971 A * | 10/2010 |
| TW | 200622240 A | 7/2006 |
| TW | 200639407 A | 11/2007 |
| WO | WO 2021098562 A1 | 5/2021 |

* cited by examiner

ACOUSTIC DEVICES WITH FEEDBACK CONTROL OF ACOUSTIC RESISTANCE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure is directed to acoustic devices, such as piezoelectric microelectromechanical systems (MEMS) microphones, and in particular to acoustic devices with feedback control of acoustic resistance.

Description of the Related Art

A MEMS microphone is a micro-machined electromechanical device used to convert sound pressure (e.g., voice sound) to an electrical signal (e.g., voltage). MEMS microphones are widely used in mobile devices, headsets, smart speakers and other voice-interface devices or systems. Conventional capacitive MEMS microphones suffer from high power consumption (e.g., large bias voltage) and reliability, for example when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power, are robust and immune to water and dust contamination. Existing piezoelectric MEMS microphones include cantilever MEMS structures, and are mostly based on sputter-deposited thin film piezoelectric structure. Such thin piezoelectric film suffers from large residual stress and stress gradient across the film thickness after deposition which results in sensitivity degradation and variation. The cantilever MEMS structure suffers from poor low-frequency roll-off control as the gap between cantilevers varies due to cantilever deflection induced by residual stress and stress gradient of the piezoelectric film or the multiple films stacked together.

SUMMARY

Accordingly, there is a need for an acoustic device with residual stress compensation, for example, a piezoelectric MEMS microphone with cantilevered piezoelectric sensors where the residual stress of the piezoelectric sensors is controlled and/or compensated.

In accordance with one aspect of the disclosure, an acoustic device, for example a piezoelectric MEMS microphone with cantilevered piezoelectric sensors, is provided with feedback control for controlling the acoustic resistance of the acoustic device. In one example, the acoustic resistance of the acoustic device (e.g., piezoelectric MEMS microphone) can be controlled based on external acoustic sound pressure and/or a parameter of the cantilevered piezoelectric sensors.

In accordance with one aspect of the disclosure, a piezoelectric microelectromechanical systems microphone is provided. The microphone comprises a substrate and one or more piezoelectric sensors movably coupled to the substrate and including a multilayer cantilever beam extending from a proximal portion attached to the substrate to a distal tip at a free end of the cantilever beam. The cantilever beam has a plurality of piezoelectric layers and a plurality of metal electrode layers, at least a portion of one of the piezoelectric layers interposed between two metal electrode layers. The microphone also comprises one or more direct current voltage sources electrically connected to one or more of the plurality of metal electrode layers. The direct current voltage source(s) are configured to apply a direct current bias voltage between at least two of the plurality of metal electrode layers to deflect the cantilever beam to at least partially counteract a deflection of the cantilever beam due to a residual stress in the cantilever beam.

In accordance with another aspect of the disclosure, an audio subsystem is provided. The audio subsystem comprises an audio codec and one or more piezoelectric microelectromechanical systems microphones in communication with the audio codec. Each microphone includes a substrate and a plurality of piezoelectric sensors movably coupled to the substrate, each of the piezoelectric sensors spaced apart from an adjacent piezoelectric sensor by a gap. Each piezoelectric sensor includes a multilayer cantilever beam extending from a proximal portion attached to the substrate to a distal tip at a free end of the cantilever beam, the cantilever beam having a plurality of piezoelectric layers and a plurality of metal electrode layers, at least a portion of one of the piezoelectric layers interposed between two metal electrode layers. The microphone also comprises one or more direct current voltage sources electrically connected to one or more of the plurality of metal electrode layers and configured to apply a direct current bias voltage between at least two of the plurality of metal electrode layers to deflect the cantilever beam to at least partially counteract a deflection of the cantilever beam due to a residual stress in the cantilever beam.

In accordance with another aspect of the disclosure, an electronic device is provided. The electronic device comprises a processor and an audio subsystem that communicates with the processor. The audio subsystem comprises one or more piezoelectric microelectromechanical systems microphones mounted on a substrate layer. Each microphone includes a substrate and a plurality of piezoelectric sensors movably coupled to the substrate, each of the piezoelectric sensors spaced apart from an adjacent piezoelectric sensor by a gap and including a multilayer cantilever beam extending from a proximal portion attached to the substrate to a distal tip at a free end of the cantilever beam. The cantilever beam has a plurality of piezoelectric layers and a plurality of metal electrode layers, at least a portion of one of the piezoelectric layers interposed between two metal electrode layers. One or more direct current voltage sources are electrically connected to one or more of the plurality of metal electrode layers and configured to apply a direct current bias voltage between at least two of the plurality of metal electrode layers to deflect the cantilever beam to at least partially counteract a deflection of the cantilever beam due to a residual stress in the cantilever beam.

In accordance with another aspect of the disclosure, a method of operating a piezoelectric microelectromechanical systems microphone is provided. The method comprises forming or providing one or more piezoelectric sensors movably coupled to a substrate, each of the piezoelectric sensors spaced apart from an adjacent piezoelectric sensor by a gap and including a multilayer cantilever beam extending from a proximal portion attached to the substrate to a distal tip at a free end of the cantilever beam. The cantilever beam has a plurality of piezoelectric layers and a plurality of metal electrode layers, at least a portion of one of the piezoelectric layers interposed between two metal electrode layers. The method also comprises applying a direct current bias voltage between at least two of the plurality of metal electrode layers to deflect the cantilever beam to at least partially counteract a deflection of the cantilever beam due to a residual stress in the cantilever beam.

In accordance with another aspect of the disclosure, a piezoelectric microelectromechanical systems microphone is provided. The microphone comprises a substrate and one or more piezoelectric sensors movably coupled to the substrate and including a multilayer cantilever beam extending from a proximal portion attached to the substrate to a distal tip at a free end of the cantilever beam. The cantilever beam has a plurality of piezoelectric layers and a plurality of metal electrode layers, at least a portion of one of the piezoelectric layers interposed between two metal electrode layers. The microphone also comprises a feedback control circuit electrically connected to one or more of the plurality of metal electrode layers. The feedback control circuit is configured to apply a direct current bias voltage between at least two of the plurality of metal electrode layers of the one or more piezoelectric sensors to actively control an acoustic resistance of the one or more piezoelectric sensors.

In accordance with another aspect of the disclosure, an audio subsystem is provided. The audio subsystem comprises an audio codec and one or more piezoelectric microelectromechanical systems microphones in communication with the audio codec. Each microphone includes a substrate and a plurality of piezoelectric sensors movably coupled to the substrate, each of the piezoelectric sensors spaced apart from an adjacent piezoelectric sensor by a gap and including a multilayer cantilever beam extending from a proximal portion attached to the substrate to a distal tip at a free end of the cantilever beam. The cantilever beam has a plurality of piezoelectric layers and a plurality of metal electrode layers, at least a portion of one of the piezoelectric layers interposed between two metal electrode layers. A feedback control circuit is electrically connected to one or more of the plurality of metal electrode layers, the feedback control circuit configured to apply a direct current bias voltage between at least two of the plurality of metal electrode layers of the one or more piezoelectric sensors to actively control an acoustic resistance of the one or more piezoelectric sensors.

In accordance with another aspect of the disclosure, an electronic device is provided. The electronic device comprises a processor and an audio subsystem that communicates with the processor. The audio subsystem comprising one or more piezoelectric microelectromechanical systems microphones mounted on a substrate layer. Each microphone includes a substrate and a plurality of piezoelectric sensors movably coupled to the substrate, each of the piezoelectric sensors spaced apart from an adjacent piezoelectric sensor by a gap and including a multilayer cantilever beam extending from a proximal portion attached to the substrate to a distal tip at a free end of the cantilever beam. The cantilever beam has a plurality of piezoelectric layers and a plurality of metal electrode layers, at least a portion of one of the piezoelectric layers interposed between two metal electrode layers. A feedback control circuit is electrically connected to one or more of the plurality of metal electrode layers, the feedback control circuit configured to apply a direct current bias voltage between at least two of the plurality of metal electrode layers of the one or more piezoelectric sensors to actively control an acoustic resistance of the one or more piezoelectric sensors.

In accordance with another aspect of the disclosure, a method of operating a piezoelectric microelectromechanical systems microphone is provided. The method comprises forming or providing one or more piezoelectric sensors movably coupled to a substrate, each of the piezoelectric sensors spaced apart from an adjacent piezoelectric sensor by a gap and including a multilayer cantilever beam extending from a proximal portion attached to the substrate to a distal tip at a free end of the cantilever beam. The cantilever beam has a plurality of piezoelectric layers and a plurality of metal electrode layers, at least a portion of one of the piezoelectric layers interposed between two metal electrode layers. The method also comprises applying with a feedback control circuit a direct current bias voltage between at least two of the plurality of metal electrode layers of the one or more piezoelectric sensors to actively control an acoustic resistance of the one or more piezoelectric sensors.

DETAILED DESCRIPTION

Figure 1A:
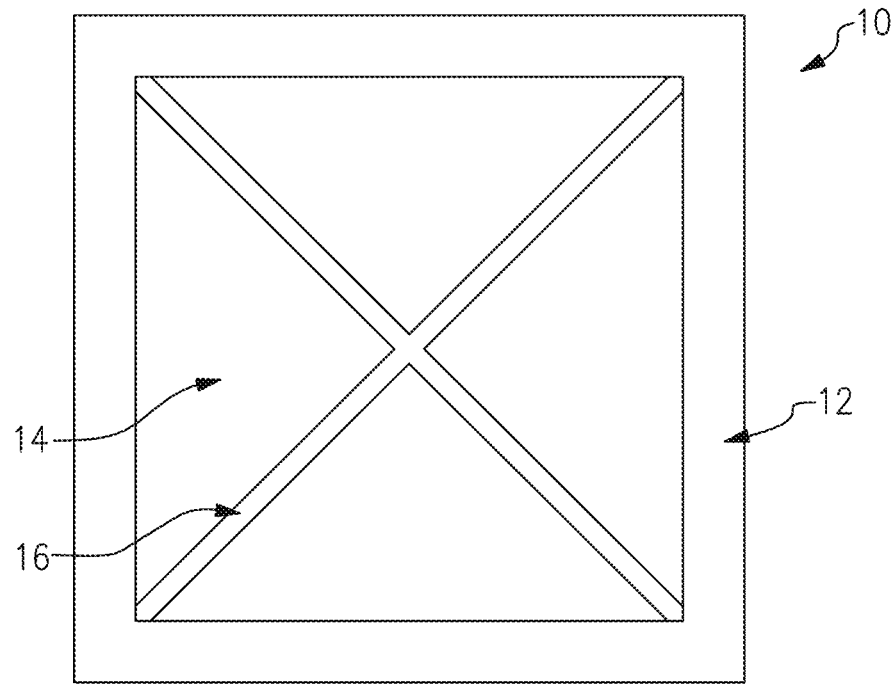
FIG. 1A is a schematic top view of a substrate and sensors for a conventional piezoelectric MEMS microphone.

The following detailed description of certain embodiments presents various descriptions of specific embodiments. However, the innovations described herein can be embodied in a multitude of different ways, for example, as defined and covered by the claims. In this description, reference is made to the drawings were like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Piezoelectric MEMS Microphone

Figure 1B:
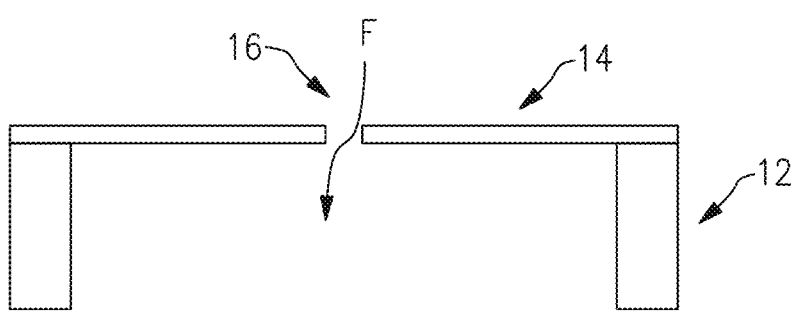
FIG. 1B is a schematic cross-sectional side view of the substrate and sensors for the piezoelectric MEMS microphone of FIG. 1A.

FIGS. 1A-1B show a conventional piezoelectric microelectromechanical systems (MEMS) microphone 10 (hereinafter the "microphone"). The microphone 10 has a substrate 12. The substrate 12 is optionally made of Silicon and may optionally have additional dielectric, metallic or semiconductor films deposited on it. The microphone 10 can have one or more piezoelectric sensors 14 (hereinafter "sensors") anchored to the substrate 12 in cantilever form with a gap 16 between adjacent sensors 14. The microphone 10 converts an acoustic signal to an electrical signal when a sound wave vibrates the sensors 14. The sensors 14 can be made from one or more layers of material. Optionally, the sensors 14 can be made at least in part of Aluminum Nitride (AlN). In another implementation, the sensors 14 can optionally be made at least in part of Scandium Aluminum Nitride (ScAlN). The sensors 14 can include an electrode, which can optionally be made of molybdenum (Mo), titanium nitride (TiN), platinum (Pt) or ruthenium (Ru), in some implementations. The gaps 16 between the sensors 14 allow the sensors 14 to freely move, for airflow F (due to sound pressure) to pass therethrough, and balance the pressure between both sides of the sensors 14. The gap 16 can be about 100-500 nm wide. The sensors 14 are preferably planar (e.g., flat), but are generally not completely flat due to a material internal stress gradient in the sensors 14.

Figure 2A:
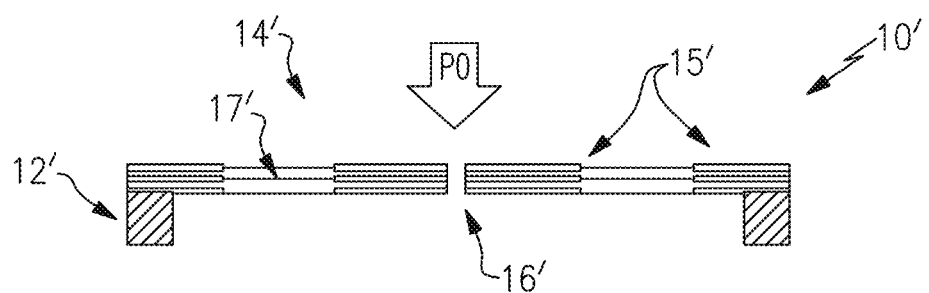
FIG. 2A is a schematic cross-sectional side view of cantilevered sensors of a piezoelectric MEMS microphone.
Figure 2B:
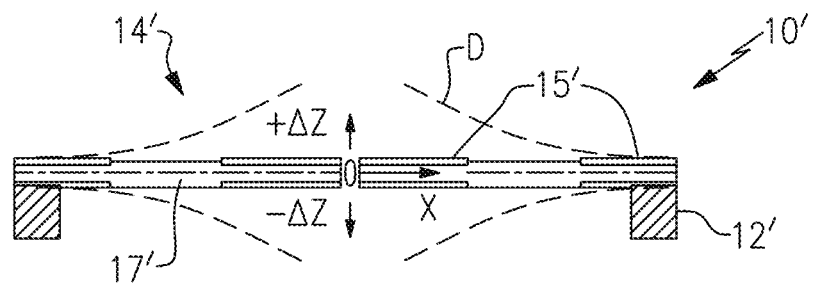
FIG. 2B is a schematic cross-sectional side view of cantilevered sensors of a piezoelectric MEMS microphone.

FIGS. 2A-2B show a piezoelectric MEMS microphone 10' (hereinafter "microphone"). The microphone 10' is similar to the microphone 10 in FIGS. 1A-1B. Thus, references numerals used to designate the various components of the microphone 10' are identical to those used for identifying the corresponding components of the microphone 10 in FIGS. 1A-1B, except that an "'" has been added to the numerical identifier. Therefore, the structure and description for the various features of the microphone 10 in FIGS. 1A-1B are understood to also apply to the corresponding features of the microphone 10' in FIGS. 2A-2B, except as described below.

The microphone 10' differs from the microphone 10 in that the cantilevered sensors 14' are bimorph piezoelectric MEMS sensors that include multiple (e.g., two) piezoelectric layers 17' and multiple (e.g., three, six) metal electrode layers 15', which can optionally be made of molybdenum (Mo), titanium nitride (TiN), platinum (Pt) or ruthenium (Ru), in some implementations. At least a portion of one (e.g., at least a portion of all) of the piezoelectric layers 17' can be interposed between two metal electrode layers 15'. The cantilevered sensors 14' extend from a proximal end attached to (e.g., anchored) to the substrate 12' and a distal tip or unsupported free end thereof. Sensors 14' can be separated by a gap 16', which allows the sensors 14' to flex independently of each other (e.g., when subjected to sound pressure P0).

FIG. 2B schematically shows the sensors 14' of the microphone 10' in a deflected state D (e.g., deflected upward or downward relative to a horizontal position) resulting in a displacement (+DZ or −DZ) of the distal tip of the cantilevered sensors 14'. Such deflection can be due to residual stress or stress gradient in the material of the cantilevered sensors 14' (e.g., due to different material parameters between the layers, such as Young's modulus, and thickness). The direction and amplitude of the deflection depends on the stress distribution in the cantilevered sensors 14'). Such deflection results in an increased width of the gap 16' between sensors 14', which results in performance degradation of the microphone 10' (e.g., decreased sensitivity).

Acoustic Devices with Residual Stress Compensation

With reference to FIGS. 3-8, the inventors have identified that the deflection of piezoelectric sensor(s) (e.g., sensor(s) 14') in a piezoelectric MEMS microphone (e.g., microphone 10') can be at least partially controlled, counteracted, reduced or otherwise compensated for by applying a voltage bias (e.g., direct current voltage bias) to the piezoelectric sensor(s). Such compensation advantageously improves the sensitivity of the piezoelectric sensor(s) and/or reduces the negative effect on the piezoelectric sensor(s) due to their residual stress.

Figure 3:
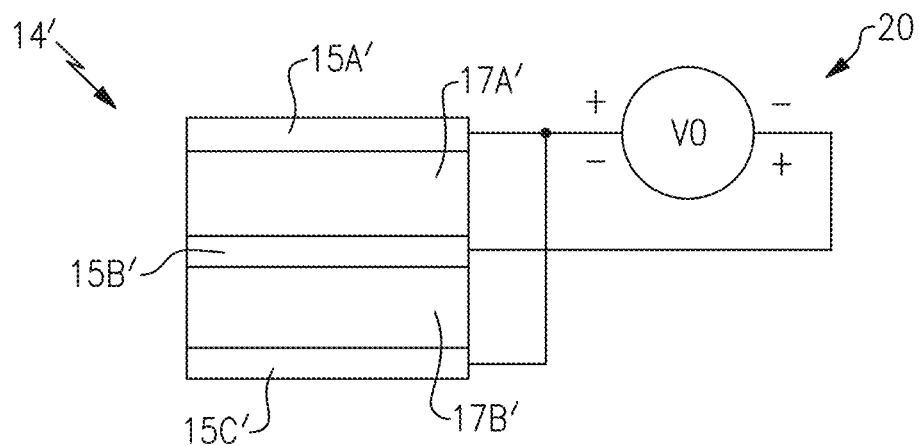
FIG. 3 is a partial schematic side view of one embodiment of a cantilevered sensor for use in a piezoelectric MEMS microphone with direct current (DC) bias.

FIG. 3 schematically shows a bipolar bias voltage source 20 electrically connected to three metal layers 15A', 15B', 15C' of a piezoelectric sensor 14'. A first piezoelectric layer 17A' is interposed between the first and second metal layers 15A', 15B' and a second piezoelectric layer 17B' is interposed between the second and third metal layers 15B', 15C'. The bipolar voltage source 20 can apply a voltage V0 of a first polarity between the first and second metal layers 15A', 15B' and can provide a voltage V0 of a second (opposite) polarity between the first and third metal layers 15A', 15C'. The voltage source 20 can apply a direct current (DC) voltage bias to the metal layers 15A', 15B', 15C', which can deflect at least a portion of the piezoelectric sensor 14' as further discussed below. The metal layers 15A', 15B', 15C' can be the same ones in the active region of the piezoelectric sensor 14' that measure deflection due to acoustic sound pressure. In another implementation, the metal layers 15A', 15B', 15C' can be separate metal layers spaced apart from the electrodes that measure deflection due to acoustic sound pressure.

Figure 4:
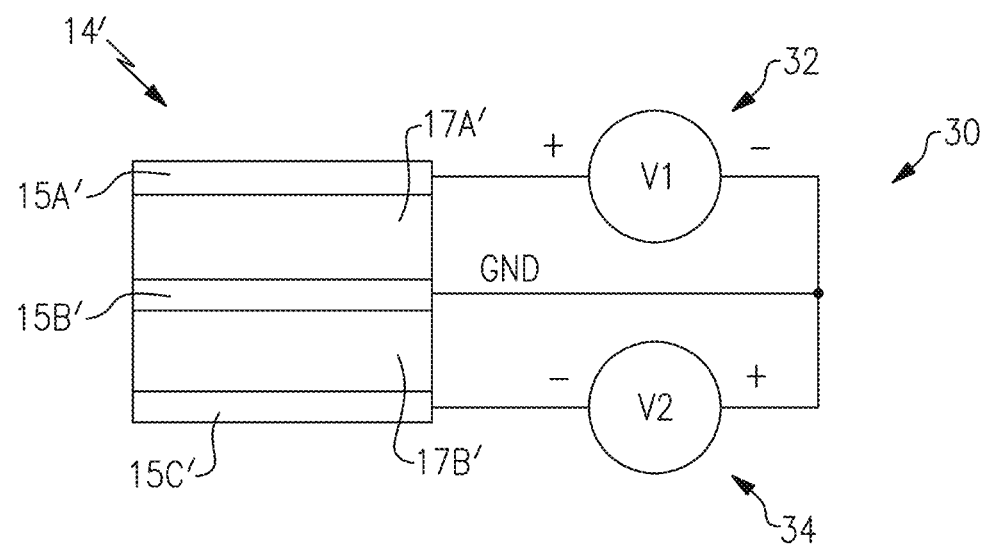
FIG. 4 is a partial schematic side view of one embodiment of a cantilevered sensor for use in a piezoelectric MEMS microphone with direct current (DC) bias.

FIG. 4 schematically shows a voltage source 30 electrically connected to the three metal layers 15A', 15B', 15C'. The voltage source 30 includes a first bias voltage source 32 electrically connected to the first and second metal layers 15A', 15B' of a piezoelectric sensor 14' and a second bias voltage source 34 electrically connected to the second and third metal layers 15B', 15C'. The first and second bias voltage sources 32, 34 can be single polarity sources. The first bias voltage source 32 can apply a first voltage V1 to the first and second metal layers 15A', 15B', and the second bias voltage source 34 can apply a second voltage V2 to the second and third metal layers 15B', 15C'. In one implementation, the first and second voltages V1, V2 can have the same magnitude. In another implementation, the first and second voltages V1, V2 can have different magnitudes. A first piezoelectric layer 17A' is interposed between the first and second metal layers 15A', 15B' and a second piezoelectric layer 17B' is interposed between the second and third metal layers 15B', 15C'.

Figure 5:
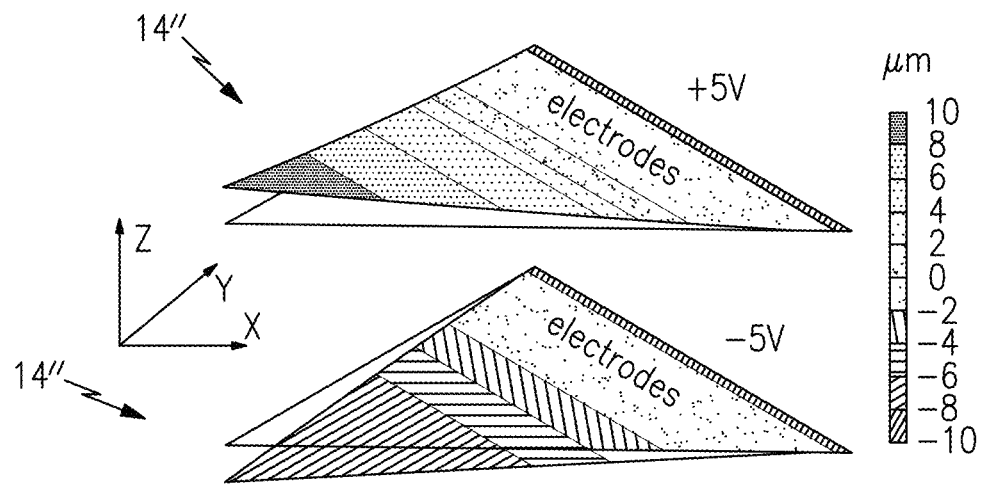
FIG. 5 is a schematic showing deflection of a cantilevered sensor for a piezoelectric MEMS microphone under DC bias.

FIG. 5 shows a piezoelectric sensor 14" to which a bias voltage of +5 Volts has been applied, causing the sensor 14" to deflect upward, and shows a piezoelectric sensor 14" to which a bias voltage of −5 Volts has been applied, causing the sensor 14" to deflect downward. The piezoelectric sensors 14A', 14B' can be similar in structure as the sensor 14' described above in connection with FIGS. 3-4, and the voltage can be applied by a bipolar voltage source (e.g., bipolar voltage source 20) or one or more single polarity sources (e.g., single polarity sources 32, 34). In FIG. 5, the piezoelectric sensors 14", 14" do not have any residual stress.

Figure 6:
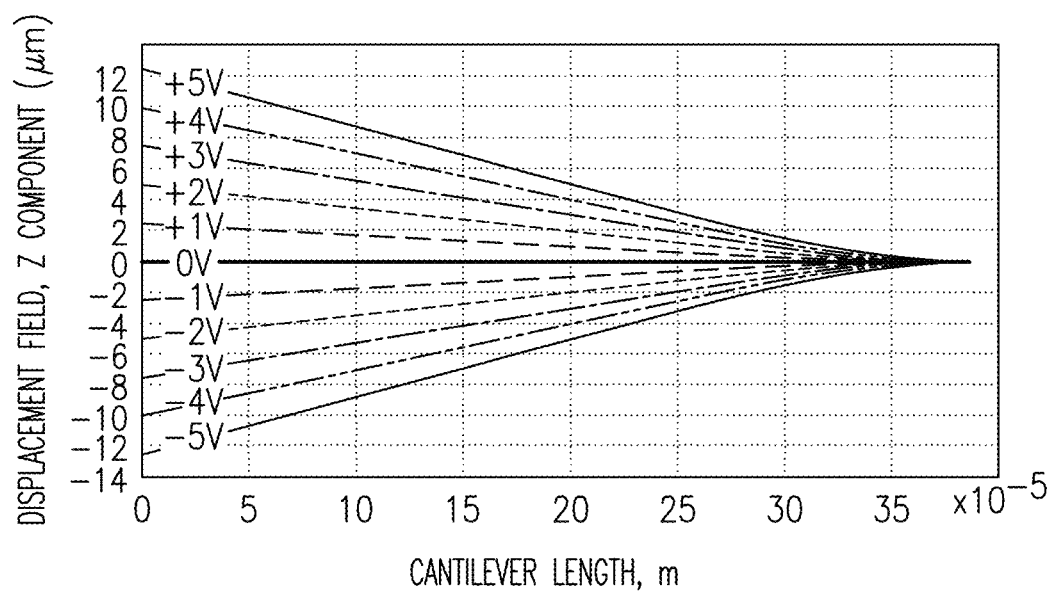
FIG. 6 is a graph of displacement versus length for a cantilevered sensor for a piezoelectric MEMS microphone when subjected to various DC bias voltages.

FIG. 6 shows a graph of displacement in the Z direction relative to cantilever length for a piezoelectric sensor, such as piezoelectric sensor 14" when subjected to various different voltages, where the piezoelectric sensor does not have residual stress. The cantilever length is measured from distal tip or unsupported free end of the piezoelectric sensor toward the constrained or anchored end of the piezoelectric sensor. In the graph, the greater a +voltage is applied (e.g., a bipolar voltage source, such as bipolar voltage source 20, or one or more single polarity sources, such as single polarity sources 32, 34), the greater the distal tip deflects upward. For example, when a bias DC voltage of +5V is applied, the distal tip is displaced upward approximately 12 um. Conversely, the greater a −voltage is applied (e.g., a bipolar voltage source, such as bipolar voltage source 20, or one or more single polarity sources, such as single polarity sources 32, 34), the greater the distal tip deflects downward. For example, when a bias DC voltage of −5V is applied, the distal tip is displaced downward approximately 12 um (e.g., shown as −12 um on FIG. 6).

Figure 7A:
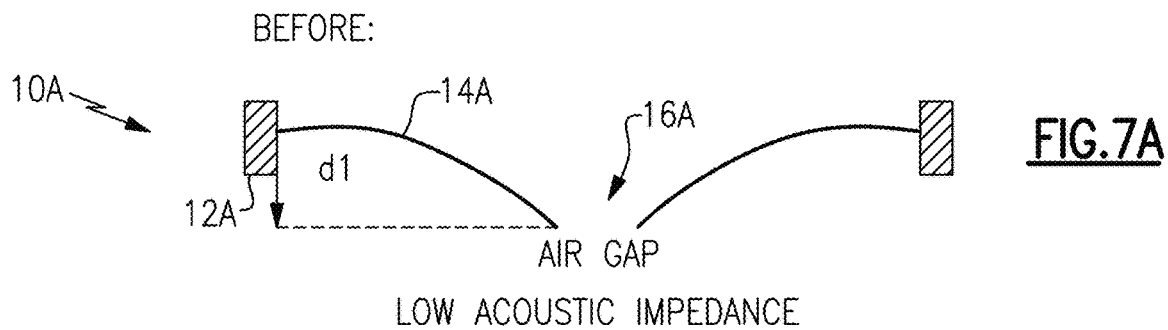
FIG. 7A is a schematic side view of a pair of cantilevered sensors for a piezoelectric MEMS microphone deflected due to residual stress in the cantilevered structure without application of a DC bias.

FIG. 7A schematically shows a piezoelectric MEMS microphone 10A with cantilevered piezoelectric sensors 14A (e.g., cantilever beam) that extend between a proximal end attached to (e.g., movably mounted) or anchored to a substrate 12A and a distal tip or unsupported free end. The microphone 10A is similar to the microphone 10' in FIGS. 2A-2B. Thus, references numerals used to designate the various components of the microphone 10A are identical to those used for identifying the corresponding components of the microphone 10' in FIGS. 2A-2B, except that an "A" has been added to the numerical identifier. Therefore, the structure and description for the various features of the microphone 10' in FIGS. 2A-2B are understood to also apply to the corresponding features of the microphone 10A in FIGS. 7A-7B, except as described below.

The piezoelectric sensors 14A can have the same structure as the piezoelectric sensor 14', 14" (e.g., multilayer structure with multiple piezoelectric layers and multiple metal electrode layers). As shown in FIG. 7A, the piezoelectric sensors 14A have residual stress (e.g., stress gradient of 100 MPa) that causes their distal tips to displace downward (e.g., vertically displace) by a distance d1. The piezoelectric sensors 14A are separated by a gap 16A, and the deflection of the sensors 14A due to their residual stress causes the size of the gap 16A to increase (e.g., relative to a sensor without residual stress where the gap is smaller), thereby reducing the sensitivity of the piezoelectric sensors 14A when subjected to sound pressure and resulting in piezoelectric sensors 14A with low acoustic impedance.

Figure 7B:
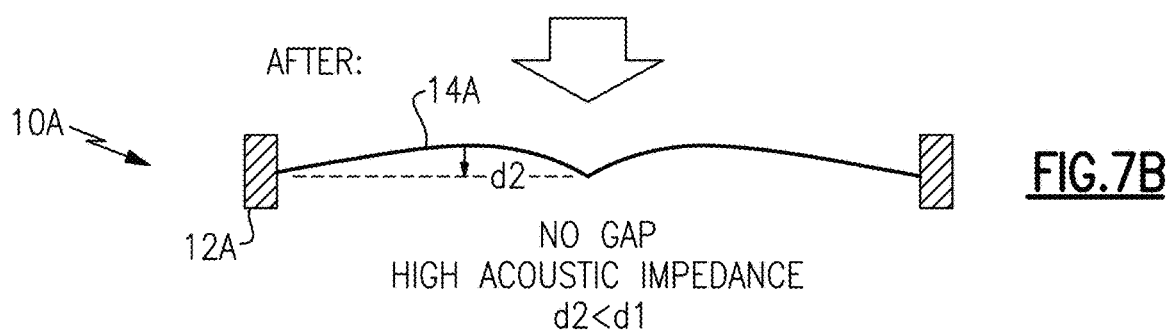
FIG. 7B is a schematic side view of a pair of cantilevered sensors of FIG. 7 with application of a DC bias.

FIG. 7B schematically shows the piezoelectric MEMS microphone 10A of FIG. 7A with a bias voltage (e.g., bias DC voltage) applied to the cantilevered piezoelectric sensors 14A (e.g., with a bipolar voltage source or one or more single polarity voltage sources). The applied bias voltage (e.g., DC bias voltage) can control, counteract, reduce or otherwise compensate for the deflection due to residual stress in the piezoelectric sensor 14A, for example so that there is no gap between the distal tips of the piezoelectric sensors 14A, resulting in the piezoelectric sensors 14A having high acoustic impedance. The applied voltage results in a deflection of the piezoelectric sensors 14A that compensates for the deflection due to residual stress, resulting in no vertical displacement for the distal tip or unsupported free ends of the piezoelectric sensors 14A. As shown in FIG. 7B, the residual stress in the piezoelectric sensors 14A can result in a displacement d2 (where d2<d1) of at least a portion of the cantilevered body of the piezoelectric sensors 14A.

Figure 8:
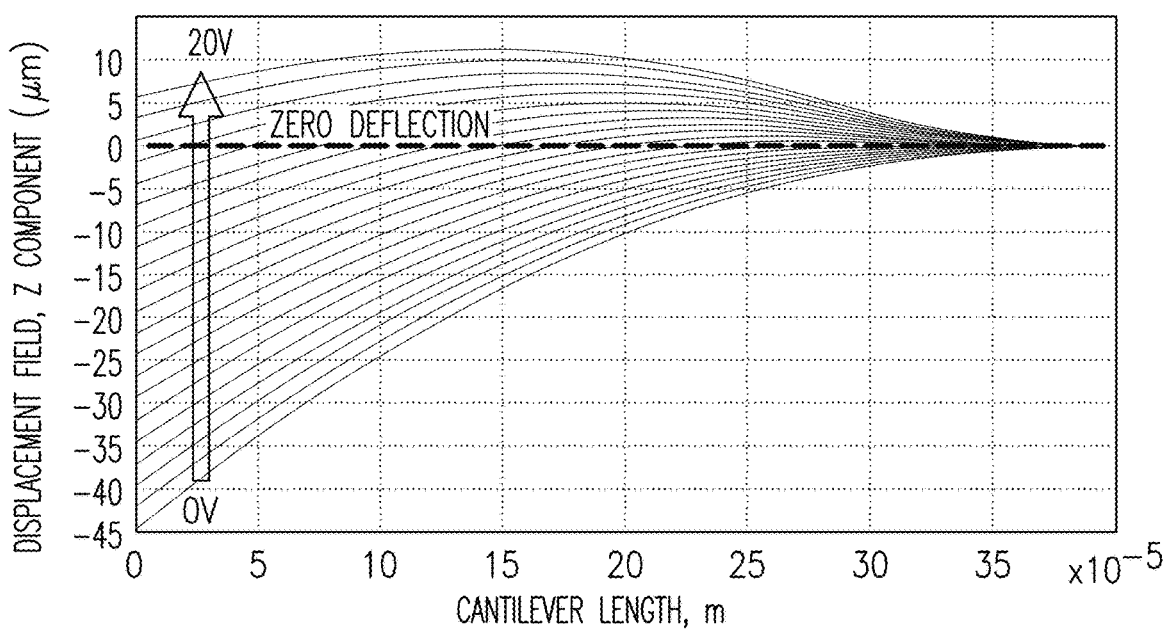
FIG. 8 is a graph of displacement versus length for a cantilevered sensor for a piezoelectric MEMS microphone when subjected to various DC bias voltages.

FIG. 8 shows a graph of displacement in the Z direction relative to cantilever length for a piezoelectric sensor, such as piezoelectric sensor 14A when subjected to various different voltages, where the piezoelectric sensor has residual stress (e.g., stress gradient of 100 MPa). The cantilever length is measured from distal tip or unsupported free end of the piezoelectric sensor toward the constrained or anchored end of the piezoelectric sensor. In the graph, the greater a voltage is applied (e.g., a bipolar voltage source that applies a voltage of between 0-20 Volts), the greater the distal tip deflects upward. For example, when a bias DC voltage of +18V is applied, the distal tip is displaced upward to approximately a location corresponding to where the distal tip would normally be positioned if the piezoelectric sensor 14A did not have residual stress (e.g., with the gap between sensors 14A being a minimum), and the cantilevered piezoelectric sensor 14A would have a curved profile as shown (e.g., due to the effect of the residual stress). Alternatively, where no voltage (e.g., 0 Volts) is applied the cantilevered piezoelectric sensor 14A displaces due to its residual stress. The voltage applied can be selected in accordance with the stress residual induced in the actual sensor 14A.

Though FIGS. 7A-7B show that residual stress causes the piezoelectric sensors 14A to deflect downward, so that application of a positive voltage at least partially counteracts or compensates for such deflection, one of skill in the art will recognize that if the residual stress caused the piezoelectric sensors 14A to deflect upward, application of a negative voltage could at least partially counteract or compensate for such deflection and the lines on the graph in FIG. would then be inverted.

Acoustic Devices with Feedback Control of Acoustic Resistance

Figure 9:
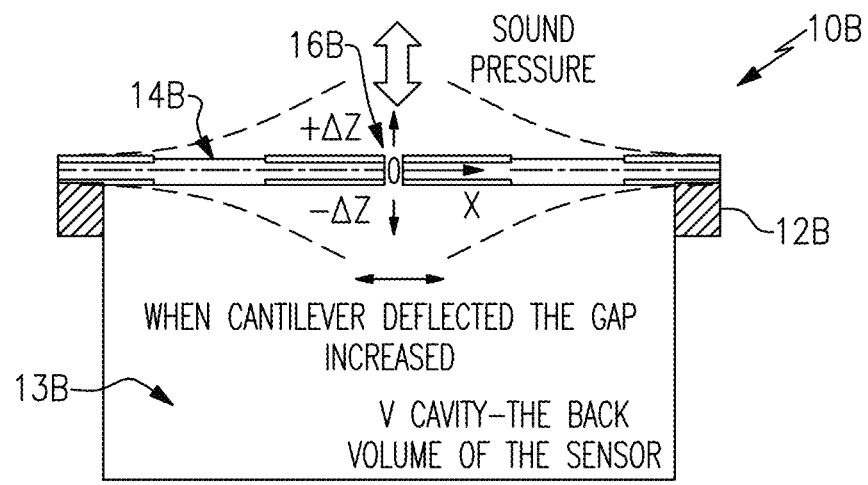
FIG. 9 is a schematic cross-sectional side view of cantilevered sensors of a piezoelectric MEMS microphone.

FIG. 9 shows a piezoelectric MEMS microphone 10B. The microphone 10B is similar to the microphone 10A in FIGS. 7A-7B. Thus, references numerals used to designate the various components of the microphone 10B are identical to those used for identifying the corresponding components of the microphone 10A in FIGS. 7A-7B, except that a "B" has been added to the numerical identifier. Therefore, the structure and description for the various features of the microphone 10A in FIGS. 7A-7B are understood to also apply to the corresponding features of the microphone 10B in FIG. 9, except as described below.

The microphone 10B has cantilevered piezoelectric sensors 14B that extend from proximal portions attached to or anchored to the substrate 12B and distal tips or unsupported free ends spaced from each other by a gap 16B. The cantilevered piezoelectric sensors 14B can be deflected by sound pressure, and the size of the gap 16B increases with increased deflection of the sensors 14B. The greater the size of the gap 16B, the greater the sensitivity and −3 dB roll-off low frequency of the sensors 14B are negatively affected (e.g., sensitivity decreases). The microphone 10B can have a back cavity 13B with a fixed volume and constant compliance. As discussed previously, when a bias voltage (e.g., DC bias voltage) is applied to the piezoelectric sensors 14B, it results in deflection of the sensors 14B. When the sensors 14B do not have residual stress, such bias voltage can deflect the sensors 14B to increase the size of the gap 16B. When the sensors 14B do have residual stress, such bias voltage can deflect the sensors 14B to at least partially compensate for the deflection due to residual stress (e.g., reduce the size of the gap 16B). The inventors have found that it is possible to achieve active control and optimization of sensor parameters, such as acoustic resistance control, by applying a bias voltage (e.g., DC bias voltage) to the piezoelectric sensors 14B.

Figure 10:
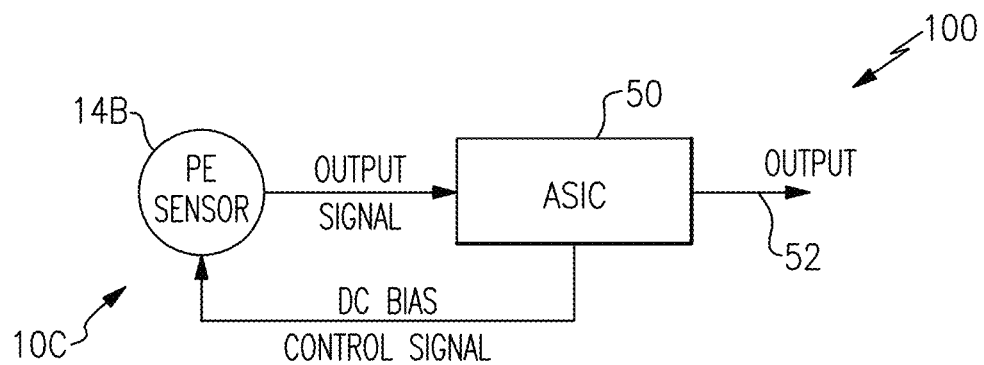
FIG. 10 is a schematic view of an intelligent cantilevered sensor of a piezoelectric MEMS microphone with a DC control feedback circuit.

FIG. 10 is a schematic of a feedback circuit 100 for controlling a piezoelectric sensor 14B. The piezoelectric sensor 14B provides an output signal to an application specific integrated circuit (ASIC) 50, which may have digital and/or analog components. The piezoelectric sensor(s) 14B, ASIC 50 and feedback circuit 100 can be part of a piezoelectric MEMS microphone package 10C. The ASIC 50 can provide a bias voltage (e.g., DC bias voltage) control signal to the piezoelectric sensor 14B to control the deflection of the sensor(s) 14B, and can provide an output signal for the piezoelectric microphone. In one implementation, the feedback circuit 100 can control the deflection of the piezoelectric sensor(s) 14B based on external acoustic sound pressure applied to the sensor(s) 14B or other sensor parameters. For example, the ASIC 50 can provide a DC bias voltage control signal the sensor(s) 14B when the external acoustic sound pressure exceeds a threshold level to control acoustic impedance of the sensor(s) 14B and/or the size of the gap 16B between the sensor(s) 14B, which can advantageously inhibit damage to the sensor(s) 14B. Additionally or alternatively, the feedback circuit 100 can control the acoustic impedance of the sensor(s) 14B to achieve a desired acoustic impedance for the piezoelectric MEMS microphone 10B (e.g., to meet customer specifications) and/or to compensate for variability in piezoelectric sensors 14B during manufacture (e.g., due to different residual stresses in different sensors 14B) so that the sensors 14B exhibit substantially the same acoustic impedance or sensitivity irrespective of differences in residual stress or other parameters (e.g., manufacturing parameters) for the sensors 14B. Advantageously, the feedback circuit 100 allows for the automatic control (e.g., DC bias voltage control) of the sensor(s) 14B, which results in an intelligent sensor 14B that can be tuned to a desired acoustic impedance or sensitivity.

Figure 11:
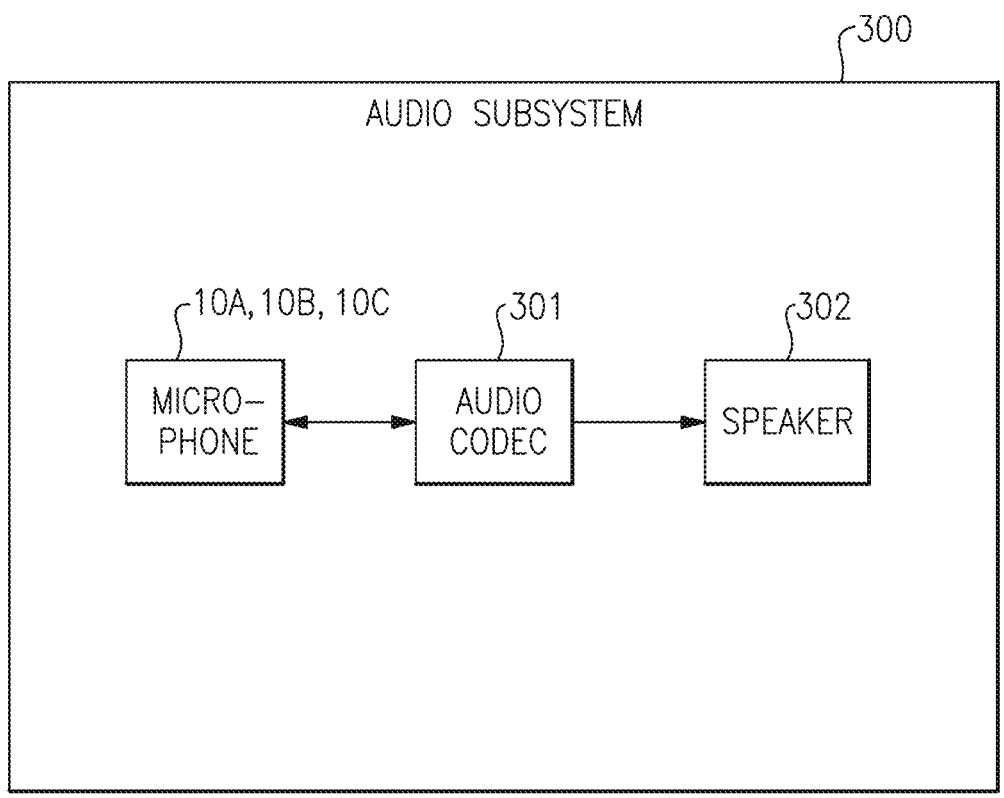
FIG. 11 is a schematic diagram of an audio subsystem.

FIG. 11 is a schematic diagram of an audio subsystem 300. The audio subsystem 300 can include one or more microphones 10A, 10B. In one implementation, at least one of the microphone(s) 10A, 10B is a piezoelectric MEMS microphone. The microphone(s) 10A, 10B can communicate with an audio codec 301, which can control the operation of the microphone(s) 10A, 10B. The audio codec 301 can also communicate with a speaker 302 and control the operation of the speaker 302.

Figure 12A:
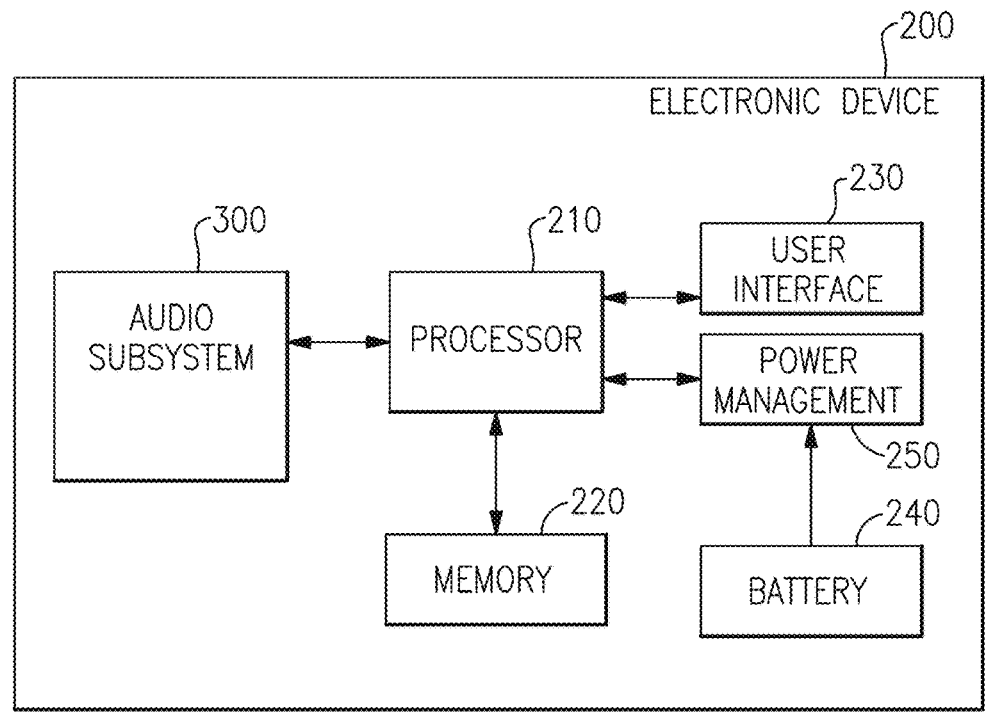
FIG. 12A is a schematic diagram of an electronic device.

FIG. 12A is a schematic diagram of an electronic device 200 that includes the audio subsystem 300. The electronic device 200 can optionally have one or more of a processor 210, a memory 220, a user interface 230, a battery 240 (e.g., direct current (DC) battery) and a power management module 250. Other additional components, such a display and keyboard can optionally be connected to the processor 210. The battery 240 can provide power to the electronic device 200.

It should be noted that, for simplicity, only certain components of the electronic device 200 are illustrated herein. The control signals provided by the processor 210 control the various components within the electronic device 200.

The processor 210 communicates with the user interface 230 to facilitate processing of various user input and output (I/O), such as voice and data. As shown in FIG. 12A, the processor 210 communicates with the memory 220 to facilitate operation of the electronic device 200.

The memory 220 can be used for a wide variety of purposes, such as storing data and/or instructions to facilitate the operation of the electronic device 200 and/or to provide storage of user information.

The power management system or module 250 provides a number of power management functions of the electronic device 200. In certain implementations, the power management system 250 includes a PA supply control circuit that controls the supply voltages of power amplifiers. For example, the power management system 250 can change the supply voltage(s) provided to one or more power amplifiers to improve efficiency.

As shown in FIG. 12A, the power management system 250 receives a battery voltage from the battery 240. The battery 240 can be any suitable battery for use in the electronic device 200, including, for example, a lithium-ion battery.

Figure 12B:
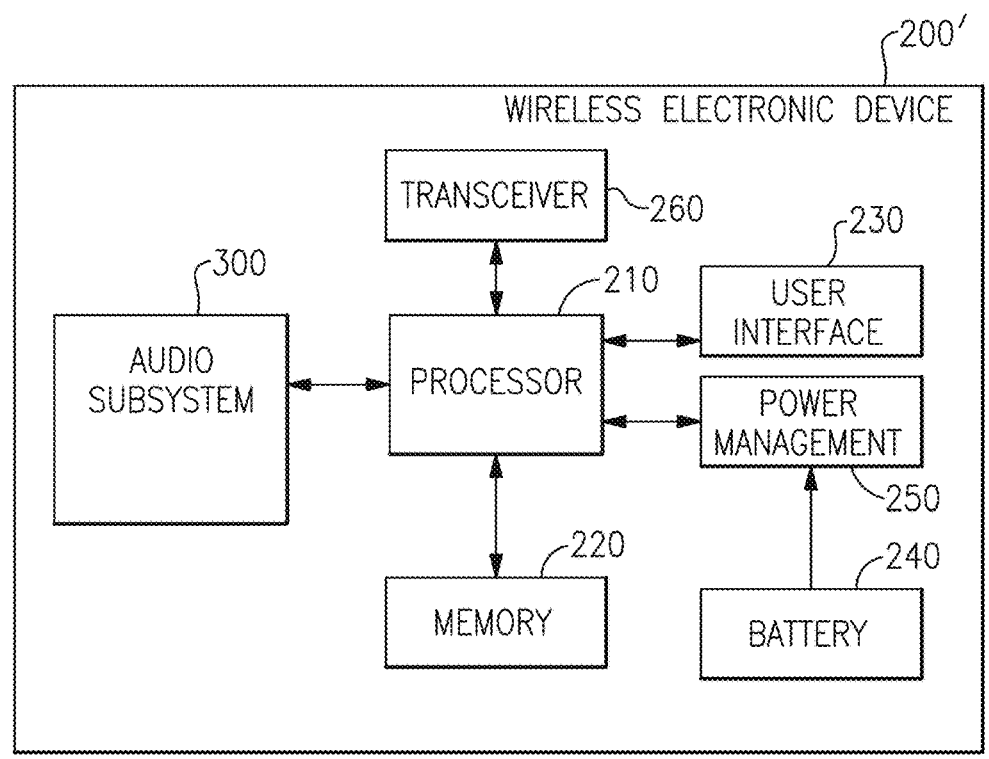
FIG. 12B is a schematic diagram of a wireless electronic device.

FIG. 12B is a schematic diagram of a wireless electronic device 200'. The wireless electronic device 200' is similar to the electronic device 200 in FIG. 12A. Thus, reference numerals used to designate the various components of the wireless electronic device 200' are identical to those used for identifying the corresponding components of the electronic device 200 in FIG. 12A. Therefore, the structure and description above for the various features of the electronic device 200 in FIG. 12A are understood to also apply to the corresponding features of the wireless electronic device 200' in FIG. 12B, except as described below.

The wireless electronic device 200' differs from the electronic device 200 in that it also includes a transceiver 260 that communicates (e.g., two-way communication) with the processor 210. Signals, data and/or information received (e.g., wirelessly) by the transceiver 260 (e.g., from a remote electronic device, such as a smartphone, tablet computer, etc.) is communicated to the processor 210, and signals, data and/or information provided by the processor is communicated (e.g., wirelessly) by the transceiver 260 (e.g., to a remote electronic device). Further, the function of the transceiver 260 can be integrated into separate transmitter and receiver components.

The wireless electronic device 200' can be used to communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 260 generates RF signals for transmission and processes incoming RF signals received from antennas. It will be understood that various functionalities associated with the transmission and receiving of RF signals can be achieved by one or more components that are collectively represented in FIG. 12B as the transceiver 260. In one example, separate components (for instance, separate circuits or dies) can be provided for handling certain types of RF signals.

The processor 210 provides the transceiver 260 with digital representations of transmit signals, which the transceiver 260 processes to generate RF signals for transmission. The processor 210 also processes digital representations of received signals provided by the transceiver 260.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the devices described herein need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed devices.

What is claimed is:

1. A piezoelectric microelectromechanical systems microphone, comprising:
   a substrate;
   one or more piezoelectric sensors movably coupled to the substrate, each of the piezoelectric sensors spaced apart from an adjacent piezoelectric sensor by a gap and including a multilayer cantilever beam extending from a proximal portion attached to the substrate to a distal tip at a free end of the cantilever beam, the cantilever beam having two piezoelectric layers and three metal electrode layers, at least a portion of a first piezoelectric layer interposed between a first metal electrode layer and a second metal electrode layer and at least a portion of a second piezoelectric layer interposed between the second metal electrode layer and a third metal electrode layer; and
   a feedback control circuit electrically connected to the three metal electrode layers, the feedback control circuit configured to receive an output signal from the one or more piezoelectric sensors and configured to apply a direct current bias voltage across the first piezoelectric layer and across the second piezoelectric layer via the three metal electrode layers of the one or more piezoelectric sensors to actively control an acoustic resistance of the one or more piezoelectric sensors, the feedback control circuit controlling the acoustic resistance of the one or more piezoelectric sensors based on external acoustic sound pressure.

2. The microphone of claim 1 wherein the feedback control circuit includes an application specific integrated circuit (ASIC) that receives the output signal from the one or more piezoelectric sensors.

3. The microphone of claim 2 wherein the application specific integrated circuit applies the direct current bias voltage across the first piezoelectric layer and across the second piezoelectric layer via the three metal electrode layers of the one or more piezoelectric sensors.

4. The microphone of claim 1 wherein the direct current bias voltage is applied by a bipolar voltage source.

5. The microphone of claim 1 wherein the direct current bias voltage is applied by one or more single polarity voltage sources.

6. The microphone of claim 1 wherein the feedback control circuit provides a direct current bias voltage control signal to the one or more piezoelectric sensors when the external acoustic sound pressure exceeds a threshold level to control acoustic impedance of the one or more piezoelectric sensors or the size of the gap.

7. An audio subsystem, comprising:
   an audio codec; and
   one or more piezoelectric microelectromechanical systems microphones in communication with the audio codec, each microphone including: a substrate and a plurality of piezoelectric sensors movably coupled to the substrate, each of the piezoelectric sensors spaced apart from an adjacent piezoelectric sensor by a gap and including a multilayer cantilever beam extending from a proximal portion attached to the substrate to a distal tip at a free end of the cantilever beam, the cantilever beam having two piezoelectric layers and three metal electrode layers, at least a portion of a first piezoelectric layer interposed between a first metal electrode layer and a second metal electrode layer and at least a portion of a second piezoelectric layer interposed between the second metal electrode layer and a third metal electrode layer, and a feedback control circuit electrically connected to the three metal electrode layers, the feedback control circuit configured to receive an output signal from the one or more piezoelectric sensors and configured to apply a direct current bias voltage across the first piezoelectric layer and across the second piezoelectric layer via the three metal electrode layers of the one or more piezoelectric sensors to actively control an acoustic resistance of the one or more piezoelectric sensors, the feedback control circuit controlling the acoustic resistance of the one or more piezoelectric sensors based on external acoustic sound pressure.

8. The audio subsystem of claim 7 wherein the feedback control circuit includes an application specific integrated circuit (ASIC) that receives the output signal from the one or more piezoelectric sensors.

9. The audio subsystem of claim 8 wherein the application specific integrated circuit applies the direct current bias voltage across the first piezoelectric layer and across the second piezoelectric layer via the three metal electrode layers of the one or more piezoelectric sensors.

10. The audio subsystem of claim 7 wherein the direct current bias voltage is applied by a bipolar voltage source.

11. The audio subsystem of claim 7 wherein the direct current bias voltage is applied by one or more single polarity voltage sources.

12. The audio subsystem of claim 7 wherein the feedback control circuit provides a direct current bias voltage control signal to the one or more piezoelectric sensors when the external acoustic sound pressure exceeds a threshold level to control acoustic impedance of the one or more piezoelectric sensors or the size of the gap.

13. An electronic device comprising:
   a processor; and
   an audio subsystem that communicates with the processor, the audio subsystem comprising one or more piezoelectric microelectromechanical systems microphones mounted on a substrate layer, each microphone including: a substrate and a plurality of piezoelectric sensors movably coupled to the substrate, each of the piezoelectric sensors spaced apart from an adjacent piezoelectric sensor by a gap and including a multilayer cantilever beam extending from a proximal portion attached to the substrate to a distal tip at a free end of the cantilever beam, the cantilever beam having two piezoelectric layers and three metal electrode layers, at least a portion of a first piezoelectric layer interposed between a first metal electrode layer and a second metal electrode layer and at least a portion of a second piezoelectric layer interposed between the second metal electrode layer and a third metal electrode layer, and a feedback control circuit electrically connected to the three metal electrode layers, the feedback control circuit configured to receive an output signal from the one or more piezoelectric sensors and configured to apply a direct current bias voltage across the first piezoelectric layer and across the second piezoelectric layer via the three metal electrode layers of the one or more piezoelectric sensors to actively control an acoustic resistance of the one or more piezoelectric sensors, the feedback control circuit controlling the acoustic resistance of the one or more piezoelectric sensors based on external acoustic sound pressure.

14. The electronic device of claim 13 wherein the feedback control circuit includes an application specific integrated circuit (ASIC) that receives the output signal from the one or more piezoelectric sensors.

15. The electronic device of claim 14 wherein the application specific integrated circuit applies the direct current bias voltage across the first piezoelectric layer and across the second piezoelectric layer via the three metal electrode layers of the one or more piezoelectric sensors.

16. The electronic device of claim 13 wherein the direct current bias voltage is applied by a bipolar voltage source.

17. The electronic device of claim 13 wherein the direct current bias voltage is applied by one or more single polarity voltage sources.

18. The electronic device of claim 13 wherein the feedback control circuit provides a direct current bias voltage control signal to the one or more piezoelectric sensors when the external acoustic sound pressure exceeds a threshold level to control acoustic impedance of the one or more piezoelectric sensors or the size of the gap.

\* \* \* \* \*